(12) United States Patent
Tan et al.

(10) Patent No.: US 10,236,428 B2
(45) Date of Patent: Mar. 19, 2019

(54) LEAD FRAME

(71) Applicant: OSRAM Opto Semiconductors GmbH, Regensburg (DE)

(72) Inventors: Weng Chung Tan, Penang (MY); Rodello Cadiz Sigalat, Penang (MY); Hussen Mohd Hanifah, JalanMedar Bayan (MY); Tobias Gebuhr, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/541,464

(22) PCT Filed: Dec. 29, 2015

(86) PCT No.: PCT/EP2015/081367
§ 371 (c)(1),
(2) Date: Jul. 3, 2017

(87) PCT Pub. No.: WO2016/110434
PCT Pub. Date: Jul. 14, 2016

(65) Prior Publication Data
US 2017/0373233 A1    Dec. 28, 2017

(30) Foreign Application Priority Data
Jan. 5, 2015   (DE) .......................... 10 2015 100 025

(51) Int. Cl.
*H01L 33/62*   (2010.01)
*H01L 25/075*  (2006.01)

(52) U.S. Cl.
CPC ............ *H01L 33/62* (2013.01); *H01L 25/075* (2013.01); *H01L 25/0753* (2013.01); *H01L 2224/42* (2013.01); *H01L 2224/48091* (2013.01); *H01L 2224/48464* (2013.01); *H01L 2924/0002* (2013.01)

(58) Field of Classification Search
CPC .... H01L 33/62; H01L 25/075; H01L 2224/42
See application file for complete search history.

(56) References Cited

U.S. PATENT DOCUMENTS

| 6,172,424 B1 | 1/2001 | Kinouchi et al. |
| 9,130,136 B2 | 9/2015 | Brandl et al. |
| 2011/0111562 A1* | 5/2011 | San Antonio ....... H01L 21/4832 438/113 |

(Continued)

FOREIGN PATENT DOCUMENTS

| DE | 19745243 A1 | 4/1998 |
| DE | 102011016566 A1 | 9/2012 |

(Continued)

*Primary Examiner* — Didarul A Mazumder
*Assistant Examiner* — Wasiul Haider
(74) *Attorney, Agent, or Firm* — Slater Matsil, LLP

(57) ABSTRACT

A lead frame is disclosed. In an embodiment, the lead frame includes a frame having a plurality of lead frame sections, wherein the lead frame sections are connected to the frame, wherein the frame has at least two longitudinal sides and at least two transverse sides, wherein at least in one longitudinal side includes an imprint, and wherein the imprint bolsters stability of the longitudinal side against sagging.

14 Claims, 5 Drawing Sheets

(56) References Cited

U.S. PATENT DOCUMENTS

| | | | | |
|---|---|---|---|---|
| 2012/0223423 A1* | 9/2012 | Hsu | ................... | H01L 23/49541 |
| | | | | 257/676 |
| 2012/0248588 A1 | 10/2012 | Yamabe | | |
| 2013/0309788 A1* | 11/2013 | Brandi | ................... | H01L 21/561 |
| | | | | 438/27 |
| 2015/0279765 A1* | 10/2015 | Wang | ................ | H01L 23/49544 |
| | | | | 257/676 |

FOREIGN PATENT DOCUMENTS

| | | |
|---|---|---|
| JP | 2002184914 A | 6/2002 |
| JP | 2004146729 A | 5/2004 |
| JP | 2009188150 A | 8/2009 |
| JP | 2013232592 A | 11/2013 |
| JP | 2014506398 A | 3/2014 |

* cited by examiner

LEAD FRAME

This patent application is a national phase filing under section 371 of PCT/EP2015/081367, filed Dec. 29, 2015, which claims the priority of German patent application 10 2015 100 025.3, filed Jan. 5, 2015, each of which is incorporated herein by reference in its entirety.

TECHNICAL FIELD

The invention relates to a lead frame, in particular, for optoelectronic components, to a method for producing a lead frame, and to a mold.

BACKGROUND

Lead frames, as are known from DE 102012109159 A1, are used in order to make electrical contact with, for example, electrical or optoelectronic components.

SUMMARY OF THE INVENTION

Embodiments of the invention provide an improved lead frame.

One advantage of the described lead frame is that mechanical stability of the lead frame is improved. This is achieved in that the lead frame has an imprint at least in one longitudinal side, which imprint bolsters stability of the longitudinal side against sagging. In this way, it is possible, for example, for thermally different coefficients of expansion between the lead frame and a molding material to be compensated for. The use of an imprint for stabilizing the lead frame has the advantage that the imprint can be made in the lead frame in a simple and cost-effective manner.

In a further embodiment, the lead frame has an imprint on two longitudinal sides, in particular on two opposite longitudinal sides. Further stabilization of the lead frame is achieved in this way.

In a further embodiment, the imprint is arranged in the middle of the longitudinal side. Good stabilization of the lead frame against sagging is achieved with little effort in this way.

In a further embodiment, the lead frame is subdivided into two fields by a transverse web. Further mechanical stabilization of the lead frame is made possible in this way.

In a further embodiment, the imprint is configured with an elongate shape, wherein the elongate shape is oriented along a longitudinal side of the frame. A further improvement in the stabilization of the lead frame is achieved in this way.

In a further embodiment, the imprint has a length which is at least twice the size of the width of the imprint. Good stabilization of the lead frame given an area which is as small as possible is achieved in this way.

In a further embodiment, the imprint has a depth in the range of from 5 to 100 µm. Experiments have shown that an imprint with these depth ranges is suitable for good stabilization of the lead frame. In addition, damage to or a reduction in the handleability of the lead frame is avoided owing to the relatively low depth.

In a further embodiment, the imprint has a length in the range of from 3 mm to 15 mm, in particular a range of between 5 mm and 10 mm. Good stabilization of the lead frame is achieved with the aid of these length ranges.

In a further embodiment, the imprint has a width in the range of from 0.5 mm to 3 mm. Adequate stabilization of the lead frame is achieved as a result.

One advantage of the described method is that the imprint is made in the lead frame in a simple manner. This is achieved in that, during a compression molding operation in which the lead frame is provided with a molding material, the imprint is additionally made in the lead frame with the aid of a stamping tool. Therefore, a dedicated process step for making the imprint is not required. The imprint is made with the aid of a mold, wherein at least one mold part has a stamping tool. The stamping tool is configured, for example, in the form of an edge.

BRIEF DESCRIPTION OF THE DRAWINGS

The above-described properties, features and advantages of this invention and the way in which they are achieved will become clearer and more distinctly understood in connection with the following description of the exemplary embodiments which are explained in greater detail in connection with the drawings, in which.

DETAILED DESCRIPTION OF ILLUSTRATIVE EMBODIMENTS

Figure 1:
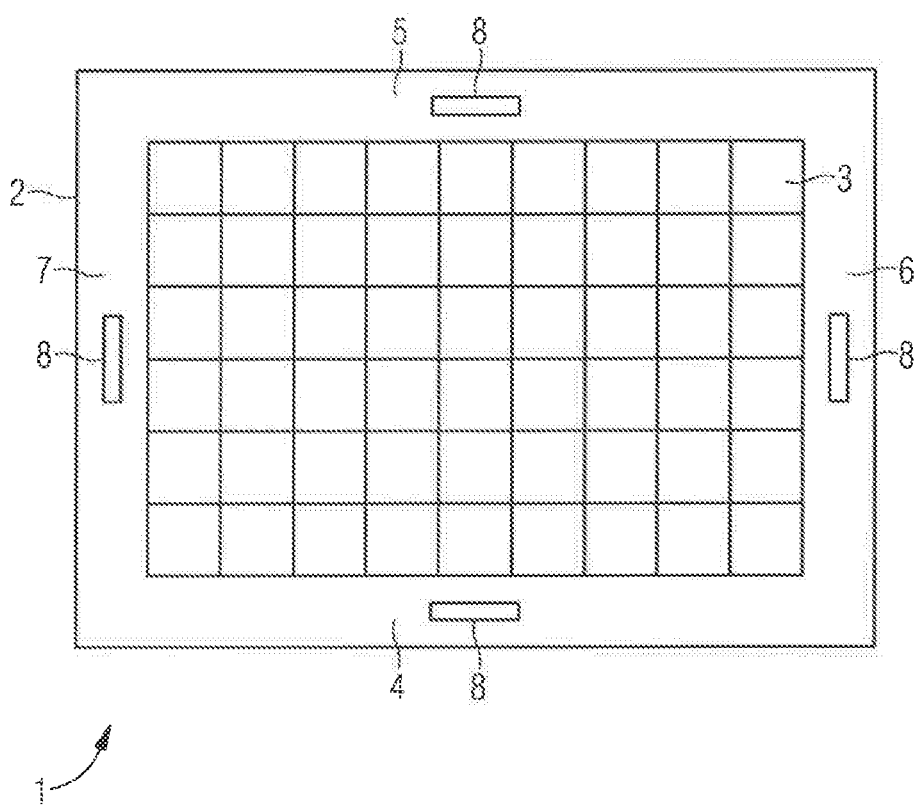
FIG. 1 shows a schematic view of a lead frame from above.

FIG. 1 shows, in a schematic view from above, a lead frame 1 which has a frame 2 and a large number of lead frame sections, not explicitly illustrated, which are connected to the frame 2. The lead frame sections are intended to provide electrical contact pads for an electrical component, in particular an optoelectronic component. Generally, at least two lead frame sections are connected to one electrical component. To this end, the component is placed on at least one lead frame section 3 and connected to the at least one lead frame section 3 or at least two lead frame sections 3 with the aid of a bonding compound, a so-called molding compound. The lead frame has, for example, a thickness in the range of from 150 to 200 µm. The lead frame 1 is formed, for example, from copper and is produced from a copper plate by a punching method, for example.

The lead frame 1 has two longitudinal sides 4, 5 and two transverse sides 6, 7. In the illustrated exemplary embodiment, an imprint 8 is in each case made in the longitudinal sides 4, 5 and in the transverse sides 6, 7. It is also possible for an imprint 8 to be made only in one longitudinal side 4, depending on the selected embodiment. In addition, an imprint 8 can be made in both longitudinal sides 4, 5 in a further embodiment. Furthermore, an imprint 8 can be made at least in one or in both transverse sides 6, 7 in one embodiment. In the illustrated exemplary embodiment, the imprint 8 is arranged in the center of a length of the longitudinal side or of the transverse side in each case. The imprint 8 can also be arranged in a different position along the longitudinal side or along the transverse side, depending on the selected embodiment. In addition, at least one longitudinal side can have more than one imprint 8 and/or at least one transverse side can have more than one imprint 8, depending on the selected embodiment. The imprint 8 can be arranged centrally with respect to a width of the frame, depending on the selected embodiment.

Figure 2:
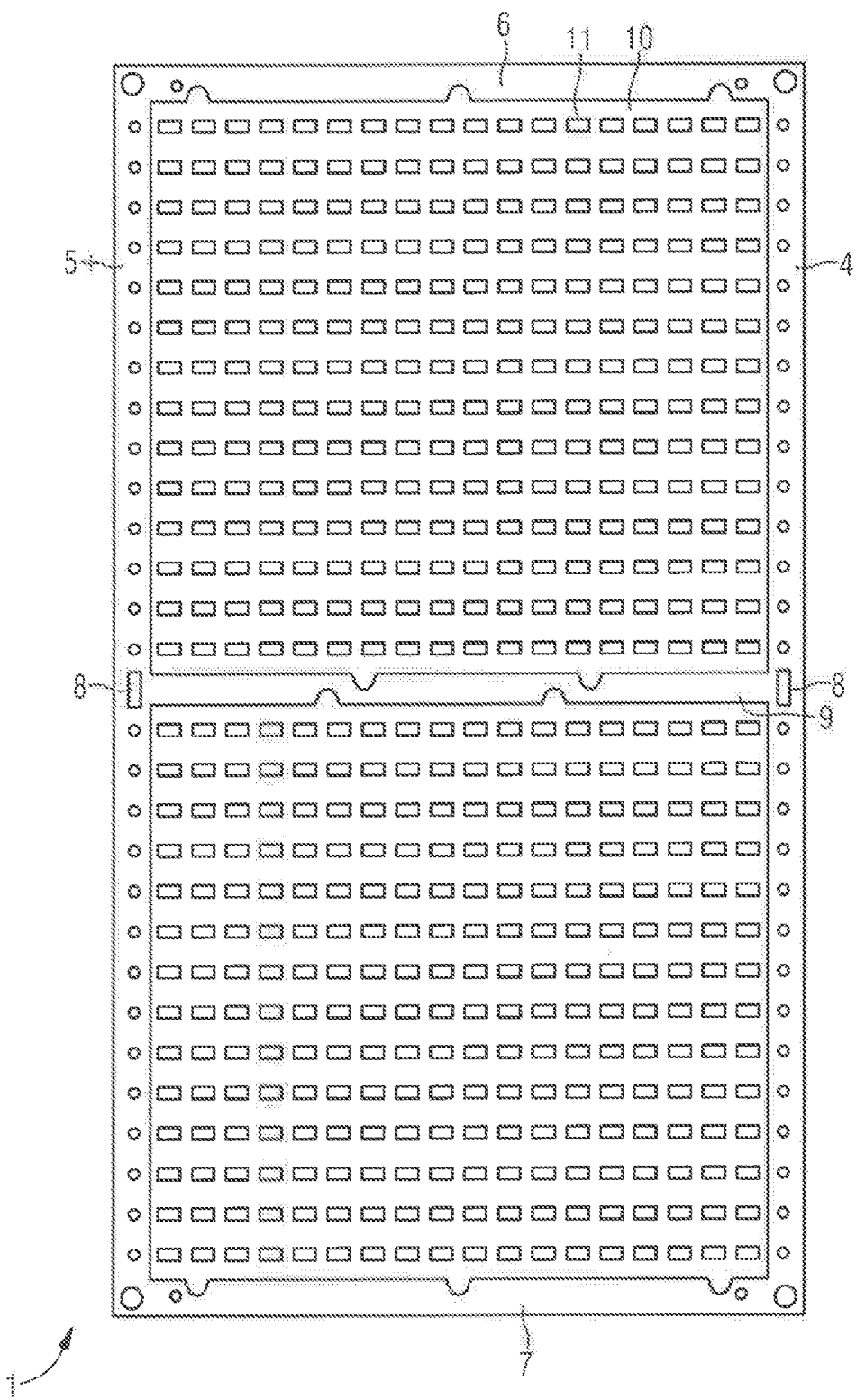
FIG. 2 shows a further embodiment of a lead frame from above.

FIG. 2 shows a further embodiment of a lead frame 1, wherein the lead frame 1 has a transverse web 9. The transverse web 9 is arranged parallel to the transverse sides 6, 7 in the center of the longitudinal sides 4, 5 and is connected to both longitudinal sides 4, 5. In addition, an imprint 8 is in each case arranged in the longitudinal sides 4, 5 in the center of the longitudinal sides 4, 5 in the illustrated exemplary embodiment. Therefore, the imprints 8 are each arranged in the region in which the transverse web 9 merges with the longitudinal sides 4, 5. The lead frame 1 is usually produced from a metal sheet. In the illustrated exemplary embodiment, a molding material 10 is applied to the lead frame 1, wherein electrical components 11 are embedded into the molding material 10. The components 11 can represent, for example, electrical and/or electronic components or optoelectronic components such as, for example, light-emitting diodes or laser diodes. The molding material used can be plastic- or silicone-based molding material. In addition, the molding material used can be epoxy.

Further imprints 8 can be provided in the longitudinal sides 4, 5 and/or further imprints 8 can be provided in the transverse sides 6, 7 of the lead frame 1, as explained with reference to FIG. 1, in the embodiment of FIG. 2 too.

In the illustrated exemplary embodiment, the imprints 8 are made on a top side that is to say on the side on which the components 11 are arranged on the lead frame 1. The imprints 8 can also be made on a bottom side of the lead frame 1 or on different sides of the lead frame 1, depending on the selected embodiment. The molding material 10 is configured in the form of a flat layer into which components 11 are embedded at least by way of the side walls, wherein, in particular, top sides of the components 1 protrude out of the molding material 10. In order to produce individual structural parts, the lead frame 1 is split into individual parts, wherein one component 11 is mechanically connected to at least one lead frame section 3 with the aid of the molding material 10.

Figure 3:
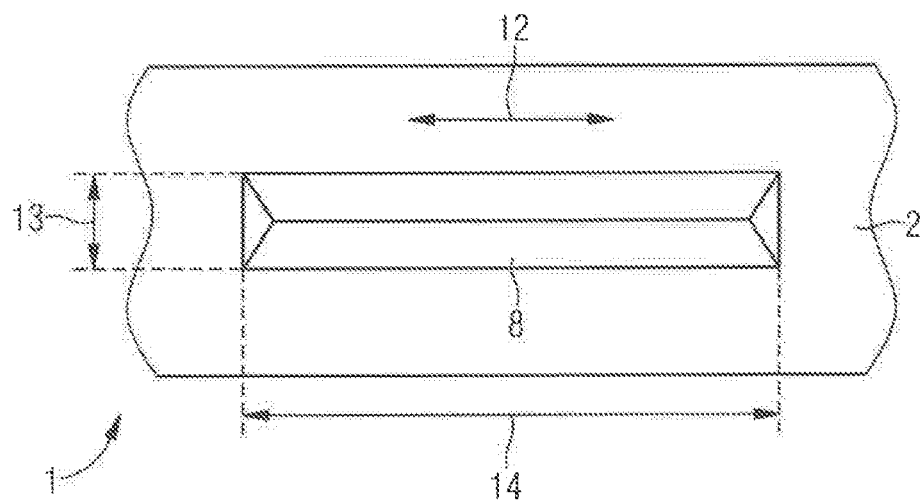
FIG. 3 is an enlarged illustration of an imprint.

FIG. 3 shows, in a schematic illustration, a plan view of a section of the lead frame 1 in which an imprint 8 is made. The illustrated section of the lead frame 1 can be a longitudinal side or a transverse side or a transverse web. In the illustrated exemplary embodiment, the imprint 8 is configured in the form of an elongate structure, in particular in the form of a rectangular strip. The imprint 8 can also have other shapes, for example, a round, an oblong or a serpentine shape, depending on the selected embodiment. The longitudinal direction of the imprint 8 is oriented parallel to the longitudinal direction 12 of the frame 2. The imprint 8 can be, for example, at least twice as long as it is wide, depending on the selected embodiment. In addition, the imprint 8 can have a length which lies in the range of from 3 mm to 15 mm. In particular, the imprint 8 can have a length which lies between 5 mm and 10 mm. Furthermore, the imprint 8 can have a width 13 which lies in the range of from 0.5 mm to 3 mm.

Figure 4:
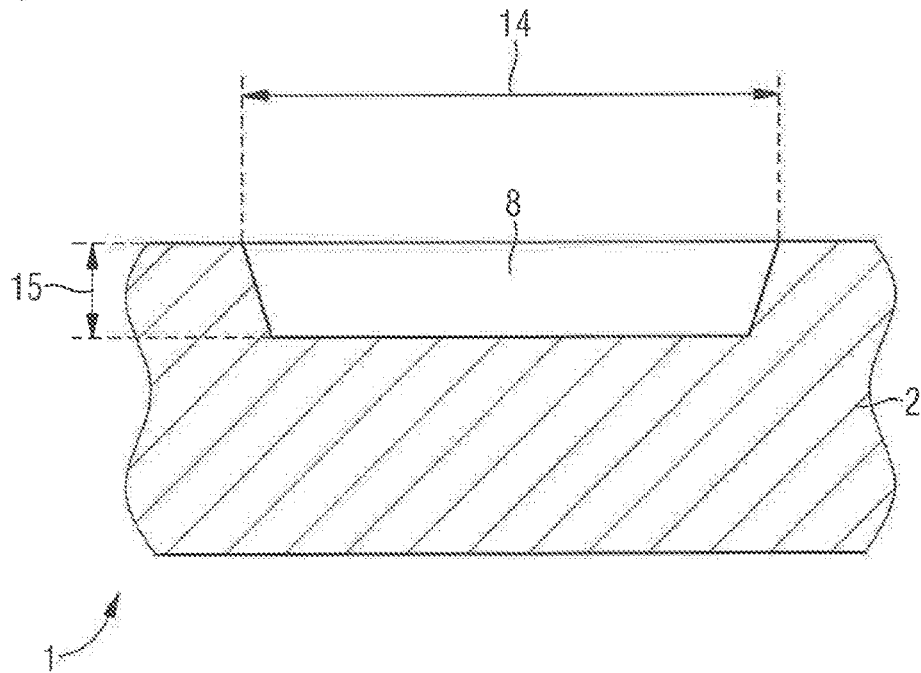
FIG. 4 shows a cross section through an imprint.

FIG. 4 shows a cross section along the longitudinal extent of the imprint 8. The imprint 8 can have a depth 15 which lies, for example, in the range of from 5 µm to 100 µm.

Figure 5:
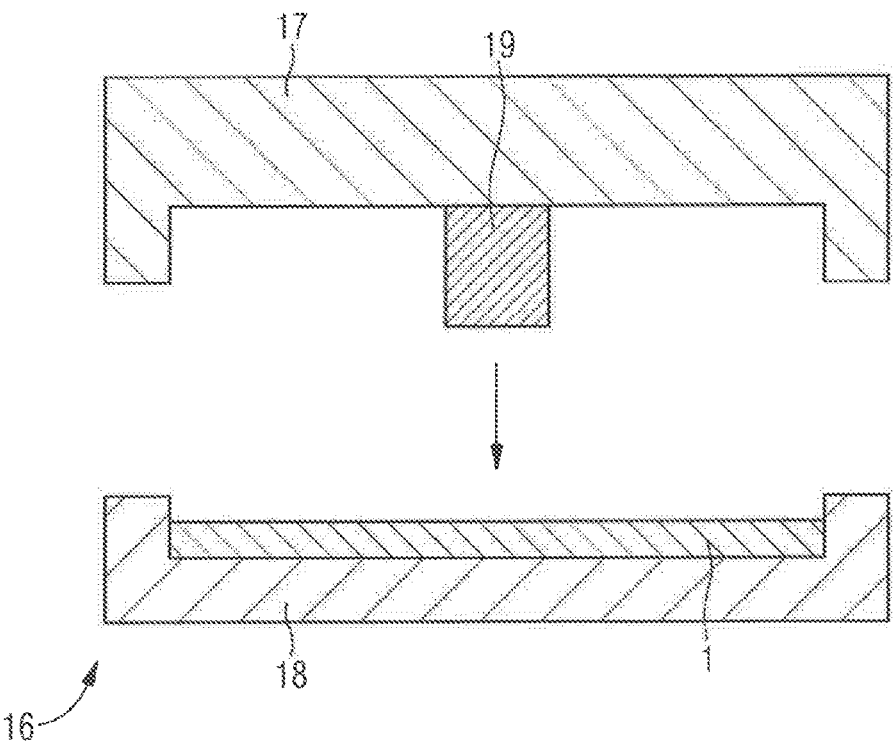
FIG. 5 shows a mold in a pre-assembly position.

FIG. 5 shows, in a schematic illustration, a mold 16 which has a first and a second mold part 17, 18. The second mold part 18 is intended to receive the lead frame 1. The first mold part 17 is intended to form a mold space 21 around the lead frame 1 together with the second mold part 18 and accordingly to shape a molding material 20. In addition, the first mold part 17 has a stamping tool 19, which is arranged on a bottom side of the mold part 17 and faces the lead frame 1, in the illustrated exemplary embodiment. The stamping tool 19 can be formed from the material of the first mold part 17 in the form of an edge, for example.

Figure 6:
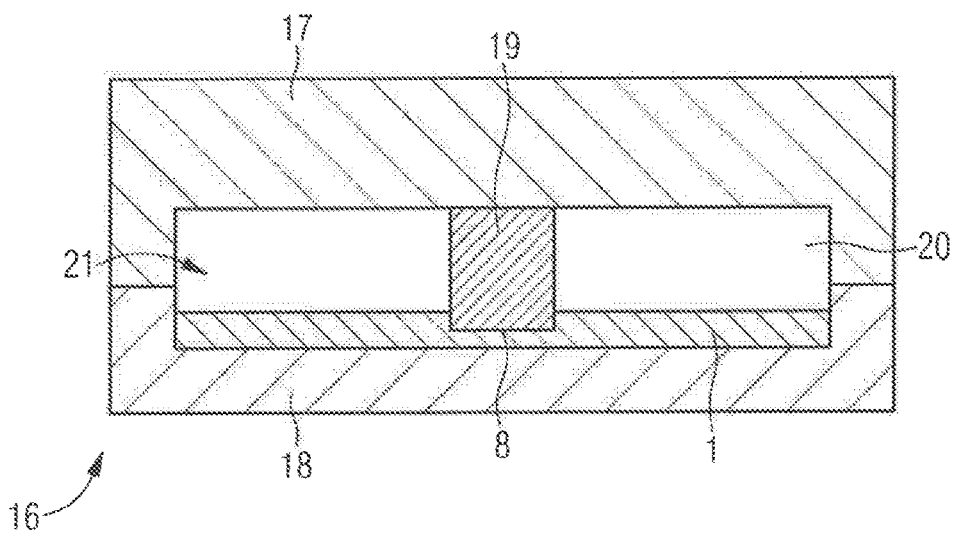
FIG. 6 shows the mold during the molding process.

FIG. 6 shows the mold 16 in a closed position in which the stamping tool 19 stamps the imprint 8 into the lead frame 1 and, in addition, molding material 20 flows into the molding space 21 between the mold parts 17, 18.

For curing purposes, the molding material is heated to temperatures of, for example, 170 to 180° C. in the mold. After removal from the mold and a subsequent cooling-down process, there may be a risk of the lead frame 1 bending or sagging on account of different thermal coefficients of expansion of the molding material and of the material of the lead frame. After curing of the molding material 20, the mold parts 17, 18 are separated from one another and the lead frame 1 is removed. In this case, the lead frame 1 is configured as illustrated in FIG. 2, for example. Owing to the imprint 8 being made, the lead frame 1 exhibits less sagging after removal from the mold 16. Owing to at least one imprint being made, corresponding sagging is at least reduced, in particular avoided. The imprint 8 can also be made in the lead frame 1 before the molding process, depending on the embodiment used.

Figure 7:
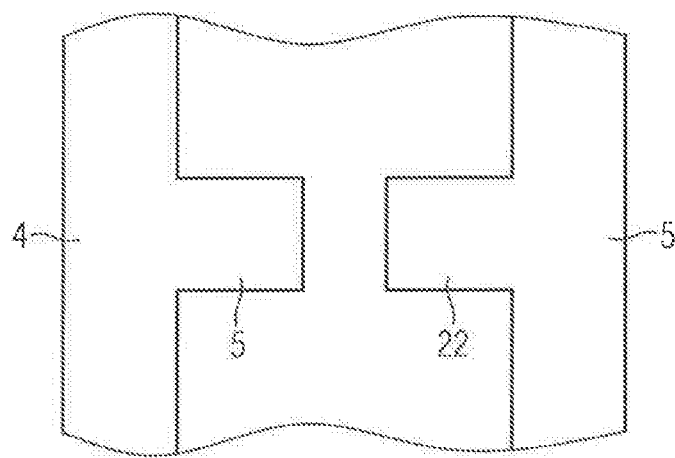
FIG. 7 is a schematic illustration of a detail of a lead frame.

FIG. 7 shows, in a schematic illustration, a detail of a simple embodiment of a lead frame 1, wherein two lead frame sections 3, 22 are illustrated. The lead frame sections 3, 22 are configured as strips and are integrally connected to longitudinal sides 4, 5 of the frame 2.

Figure 8:
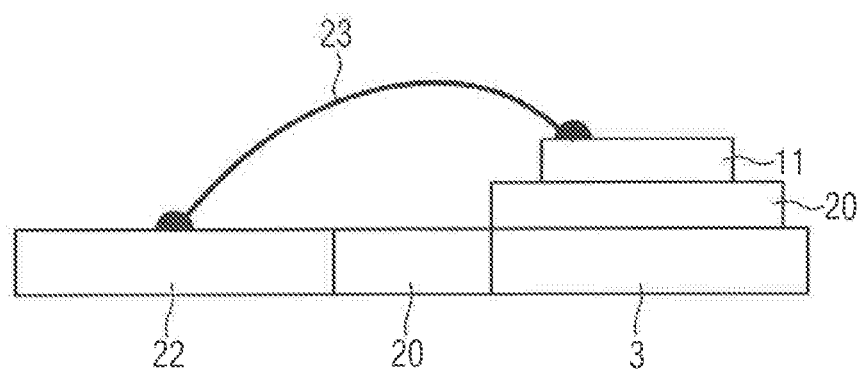
FIG. 8 is a schematic illustration of a structural part.

FIG. 8 shows, in a schematic side view, a structural part having a component 11. The component 11 is mounted on the first lead frame section 3. In addition, the component 11 is mechanically connected to the second lead frame section 22 with the aid of the molding material. Furthermore, the component 11 is electrically connected to the second lead frame section 22 by means of a bonding wire 23.

Although the invention has been more specifically illustrated and described in detail by means of the preferred exemplary embodiment, the invention is not restricted by the examples disclosed and other variations may be derived therefrom by the person skilled in the art, without departing from the scope of protection of the invention.

The invention claimed is:

1. A lead frame comprising:
a frame having a plurality of lead frame sections,
wherein the lead frame sections are connected to the frame,
wherein the frame has at least two longitudinal sides and at least two transverse sides,
wherein at least one longitudinal side comprises an imprint,
wherein the imprint bolsters stability of the longitudinal side against sagging,
wherein the frame has a transverse web,
wherein the transverse web is arranged parallel to the transverse sides, and
wherein the imprint is arranged in a region in which the transverse web merges in the longitudinal sides.

2. The lead frame according to claim 1, wherein both longitudinal sides comprise an imprint.

3. The lead frame according to claim 1, wherein the imprint is arranged in a middle of the longitudinal side.

4. The lead frame according to claim 1, wherein the transverse web is arranged in a middle of the longitudinal side.

5. The lead frame according to claim 1, wherein in each longitudinal side an imprint is arranged in a region in which the transverse web merges in the longitudinal sides.

6. The lead frame according to claim 1, wherein the imprint has an elongate shape, and wherein the imprint is oriented along a longitudinal direction of a longitudinal side.

7. The lead frame according to claim 6, wherein the imprint is at least twice as long as it is wide.

8. The lead frame according to claim 1, wherein the imprint has a depth between 5 µm inclusive and 100 µm inclusive.

9. The lead frame according to claim 1, wherein the imprint has a length between 3 mm inclusive and 30 mm inclusive.

10. The lead frame according to claim 1, wherein the imprint has a width between 0.5 mm inclusive and 18 mm inclusive.

11. The lead frame according to claim 1, wherein the lead frame has a thickness between 100 µm inclusive and 300 µm inclusive.

12. The lead frame according to claim 1, wherein the lead frame comprises copper.

13. The lead frame according to claim 1, wherein the lead frame comprises a molding material.

14. A lead frame comprising:
a frame having a plurality of lead frame sections,
wherein the lead frame sections are connected to the frame,
wherein the frame has at least two longitudinal sides and at least two transverse sides,
wherein at least one longitudinal side comprises an imprint,
wherein the frame has a transverse web,
wherein the transverse web is arranged parallel to the transverse sides,
wherein the imprint is arranged in a region in which the transverse web merges in the longitudinal sides,
wherein the imprint bolsters stability of the longitudinal side against sagging,
wherein in each longitudinal side an imprint is arranged in a region in which the transverse web merges in the longitudinal sides,
wherein the imprint has an elongate shape,
wherein the imprint is oriented along a longitudinal direction of a longitudinal side, and
wherein the imprint has a depth between 5 µm inclusive and 100 µm inclusive.

* * * * *